United States Patent [19]

Stoyko

[11] Patent Number: 5,796,033
[45] Date of Patent: *Aug. 18, 1998

[54] ELECTRICALLY CONDUCTIVE JOINT

[75] Inventor: Michael T. Stoyko, Newberg, Oreg.

[73] Assignee: Gerome Manufacturing Company, Inc., Uniontown, Pa.

[*] Notice: The term of this patent shall not extend beyond the expiration date of Pat. No. 5,532,427.

[21] Appl. No.: 656,464

[22] Filed: May 31, 1996

[51] Int. Cl.$^6$ .................................. H05K 9/00
[52] U.S. Cl. ...................... 174/35 C; 174/35 GC; 29/505; 220/682
[58] Field of Search .................. 174/35 R, 35 MS, 174/35 GC; 361/816, 818; 220/682; 428/209; 29/505

[56] References Cited

U.S. PATENT DOCUMENTS

| | | | |
|---|---|---|---|
| 2,876,275 | 3/1959 | Schulz | 174/35 R |
| 3,340,587 | 9/1967 | Beyer | 29/155 |
| 4,652,695 | 3/1987 | Busby | 174/35 GC |
| 5,028,740 | 7/1991 | Tomiya | 174/35 R |
| 5,198,290 | 3/1993 | Niioka | 428/263 |
| 5,532,427 | 7/1996 | Stoyko | 174/35 R |

*Primary Examiner*—Kristine L. Kincaid
*Assistant Examiner*—Hung V. Ngo
*Attorney, Agent, or Firm*—Armstrong, Westerman, Hattori, McLeland & Naughton

[57] ABSTRACT

An electrically conductive joint and method of making, which includes off-setting a portion of one end of a composite sheet having a conductive layer and an insulative layer, bending a part of the off-set portion into a first leg with the insulative layer on the inside of the bend, bending an edge portion of a second end of the sheet into a second leg with the insulative layer on the outside of the bend, juxtaposing the two legs and compressing them to form a continuous contact joint between the conductive layers of the two ends, forming the sheet into a magnetically-shielding housing with the joint disposed on the inside of the housing.

9 Claims, 1 Drawing Sheet

ELECTRICALLY CONDUCTIVE JOINT

BACKGROUND OF THE INVENTION

1. Field of the Invention

This invention relates to an electrically conductive joint, and more specifically to a joint formed of a sheet of electrically conductive material having one surface coated with an electrically insulating coating, and which joint is useful in the fabrication of magnetic shielding for electrical apparatus. More specifically, the invention is directed to a magnetically-shielding housing formed of such sheet, with the joint disposed on the inside of the housing.

2. Related Prior Art

It is known in the prior art to provide hollow housings for magnetic shielding of electrical apparatus. For example, U.S. Pat. No. 5,028,740 discloses such a housing comprising an electrically conductive sheet, one surface of which is coated the an insulating material such as a paint, resin, etc. A joint is formed by bending one end of a sheet of such material into a hairpin shape and connecting that bent end to the other end of the sheet by means of rivets or screws.

U.S. Pat. No. 2,876,275 shows a shielding panel comprising a rigid member, such as plywood, provided with a metal sheathing terminating in L-shaped portions which can be locked together to provide continuity of electrical conductivity from panel-to-panel.

U.S. Pat. No. 3,340,587 discloses electromagnetic shielding enclosures wherein panels are disposed in edge-to-edge relationship, with U-shaped spring clips into which panel flanges are inserted to provide an electrically continuous wall of panels.

U.S. Pat. No. 5,198,290 discloses an electromagnetic shielding material comprising a flexible base fabric, a first metallic film formed by flame-spraying a metal, such as Zn, on one side of the fabric, and a second metallic film, such as Al foil, formed on the other side of the fabric. No joint is shown.

U.S. Pat. No. 4,652,695 discloses a clip enclosing an end of a knit mesh material and adapted to be installed around the periphery of a door in a shielding enclosure to maintain electrical continuity in the enclosure.

None of such prior art provides a joint in a conductive metal sheet having one insulated surface, formed only by bending the sheet.

This present invention is an improvement of that of U.S. patent application Ser. No. 08/328,141 which is directed to a joint formed by bending opposed edges of a sheet of conductive metal coated with an electrically insulating material, wherein the sheet is formable into a shielding container with the formed joint on the outside of the container.

SUMMARY OF THE INVENTION

Therefore it is an object of the invention to provide an electrically conductive inside joint of a sheet of conductive material coated on one surface thereof with an electrically insulating material merely by properly bending the composite sheet material. This is done by providing one end of the sheet with an off-set portion and then bending an end part of the off-set portion into the form of a first depending leg with the insulating material on the inside of the leg. The other end of the sheet is bent into the form of a second depending leg with the insulating material on the outside of the leg. The two depending legs then are juxtaposed and the two ends compressed into the form of a joint wherein electrically conductive surfaces are in face-to-face contact, providing continuity of electrical conductivity and the thus-formed joint is disposed on the inside of a shielding container formed from the sheet.

DESCRIPTION OF PREFERRED EMBODIMENTS

Figure 1:
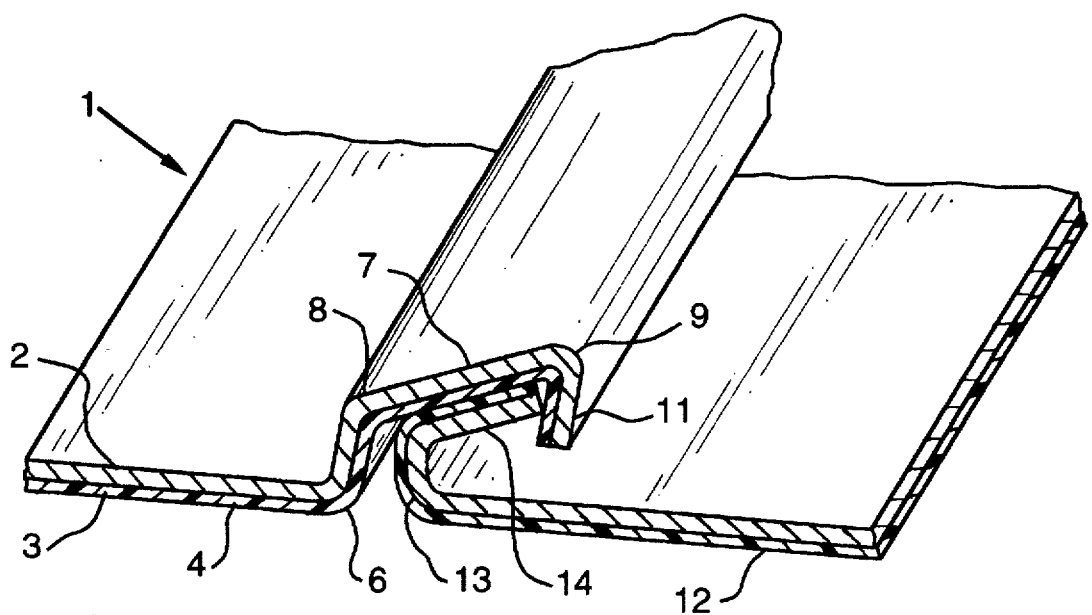
FIG. 1 is an isometric view of both ends of the sheet wherein one of the opposed edges of the sheet is provided with an off-set portion forming a first dependent leg and the other opposed edge of the sheet is bent in an angle forming a second dependent leg.

FIG. 1 shows a first stage of formation of the inventive joint wherein a sheet 1 comprises an electrically conductive layer 2 e.g. of metal such as aluminum or copper, and an electrically insulative layer 3, e.g. of a polyvinyl chloride (PVC), shown in hatched lines. A first end 4 of the sheet 1 is bent as at 6, providing an off-set portion 7. Off-set portion 7 is bent as at 8 and 9, forming a first dependent leg 11 at an acute angle to the remainder of the off-set portion and wherein the insulative layer 3 is on the inside of the bend.

In FIG. 1 there also is shown a second end 12 of the composite sheet, bent as at 13, providing a second dependent leg 14 forming an acute angle with the remainder of the second end of the sheet and wherein the insulative layer 3 is on the outside of the bend.

Figure 2:
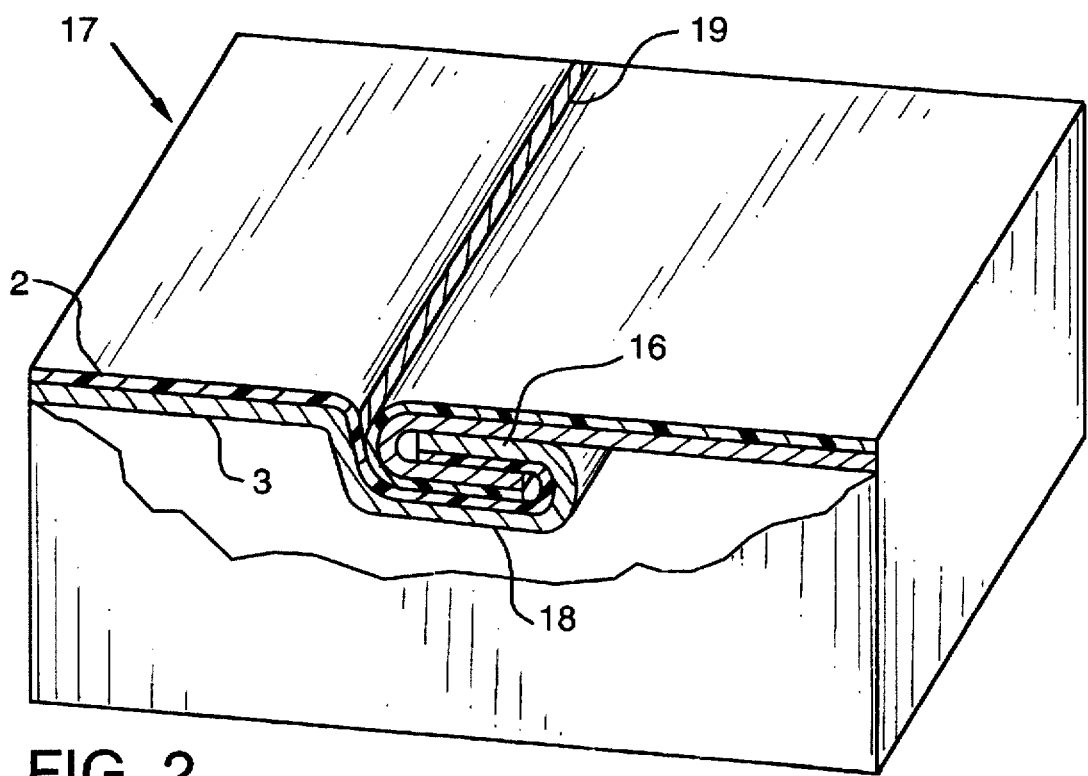
FIG. 2 an isometric view of the two ends of the sheet assembled with the first and second legs juxtaposed and compressed into the form of a final joint formed on the inside of a hollow, magnetic-shielding housing formed of the sheet material.

As shown in FIG. 2, when end 4 and end 12 of the formed sheet are assembled, the first dependent leg 11 is juxtaposed to the second dependent leg 14 and, when this assembly is compressed, the collapsed dependent legs 11 and 14 provide continuous metal-to-metal contact, as at 16.

As also shown in FIG. 2, a hollow housing denoted generally by the numeral 17 is formed with ends 4 and 12 of the sheet material connected with a formed joint 18, disposed on the inside of the housing, leaving only a narrow seam 19 on the outside of the housing. Such a housing is useful for surrounding and magnetically shielding an electrical apparatus, and, with the seam on the inside of the housing, makes an aesthetically pleasing presentation.

The joint of the invention requires no separate joining means such as rivets, screws, clips or the like but is formed only by bending and assembling the ends of the composite sheet material and compressing the assembly thereby locking the ends in place and forming a continuous electrical contact between the compressed ends of the sheet.

What is claimed is:

1. A method of forming an electrically conductive joint in a sheet of material having top and bottom surfaces wherein one of said surfaces is formed of an electrically conductive layer and the other of said surfaces is formed of a layer of electrically insulative material overlying and bonded to the electrically conductive layer, comprising bending a portion of a first end of said sheet material to form an off-set portion spaced from the remainder of said first end of said sheet material, bending an edge part of the off-set portion into the form of a first dependent leg forming an angle with the remainder of the off-set portion and having said insulative layer on the inside of the bent part, bending an edge portion of a second end of said sheet material into the form of a second dependent leg forming an angle with the remainder of said second end of said sheet material and having said insulative layer on the outside of the bent portion, assembling the first and second ends of the sheet material with the first and second dependent legs juxtaposed to each other, and compressing the first and second ends to collapse each of said first and second legs into a position parallel to the top and bottom surfaces of the sheet material whereby conductive surface portions of each of the first and second legs are in face-to-face relationship forming a continuous electrically conductive contact.

2. A method of making an electrically conductive joint comprising off-setting a portion of a first end of a composite sheet having a conductive layer and an insulative layer, bending a part of the off-set portion into a first leg with the insulative layer on the inside of the bend part, bending an edge portion of a second end of the sheet into a second leg with the insulative layer on the outside of the bent portion, juxtaposing the two legs and compressing them to form a continuous contact between the conductive layers of the two ends.

3. An electrically conductive joint comprising a composite sheet having a conductive layer and an insulative layer and having a portion of a first end of the sheet of-set and wherein a part of the off-set portion is bent into the form of a first leg with the insulative layer on the inside of the bent part, a second end of the sheet having an edge portion bent into the form of a second leg with the insulative layer on the outside of said bent portion, wherein, when the two legs are juxtaposed and compressed, they form a continuous contact between the juxtaposed legs of the conductive layer of each of the first and second ends.

4. A hollow housing for surrounding and magnetically shielding an electrical apparatus, comprising a sheet material having an electrically conductive layer and an electrically insulative layer overlying and bonded to the electrically conductive layer and comprising a joint disposed inside the housing and formed of the sheet material and having a bent portion of a first end of said sheet material forming an off-set portion spaced from the reminder of said first end of said sheet material, said off-set portion having an edge part bent into the form of a first dependent leg forming an angle with the remainder of the off-set portion and having said insulative layer on the inside of the bent part, a second end of said sheet material having an edge portion bent into the form of a second dependent leg forming an angle with the remainder of said second end of said sheet material and having said insulative layer on the outside of the bent portion, said first and second ends of said sheet material being assembled with the first and second dependent legs juxtaposed to each other and wherein, when said first and second legs are compressed, each of said first and second legs is collapsed into a position parallel to top and bottom surfaces of said sheet material whereby conductive surface portions of each of the first and second legs are in face-to-face relationship forming a continuous electrically conductive contact.

5. An electrically conductive joint formed of a sheet of material comprising a layer of conductive material and having one surface of the sheet coated with an electrically insultative layer, comprising a first end of the sheet having an off-set portion and an edge part of the off-set portion bent into the form of a first depending leg forming an angle with the remainder of the off-set portion with the insulative layer on the inside of the bent part, a second end of the sheet having an edge portion thereof bent into the form of a second dependent leg forming an angle with the remainder of the second end of the sheet with the insulative layer on the outside of the bent portion, wherein, when the first and second ends of the sheet are juxtaposed with the first and second legs in face-to-face relationship with each other and compressed, the joint provides continuous electrical contact between the electrically conductive layers of the two ends of the sheet.

6. A hollow housing for surrounding and magnetically shielding an electrical apparatus, comprising a sheet material having an electrically conductive layer and an electrically insulative layer overlying and bonded to the electrically conductive layer and comprising a joint disposed inside the housing and formed of the sheet material wherein a first end of the sheet has an off-set portion and an edge part of the off-set portion bent into the form of a first depending leg forming an angle with the remainder of the off-set portion with the insulative layer on the inside of the bent part, a second end of the sheet having an edge portion thereof bent into the form of a second dependent leg forming an angle with the remainder of the second end of the sheet with the insulative layer on the outside of the bent portion, and wherein, when the first and second ends of the sheet are juxtaposed with the first and second legs in face-to-face relationship with each other and compressed, the joint provides continuous electrical contact between the juxtaposed portions of the electrically conductive layer of each of the first and second ends of the sheet.

7. An electrically conductive joint formed of a sheet of material having top and bottom surfaces one of said surfaces is formed of an electrically conductive layer and the other of said surfaces is formed of a layer of electrically insulative material overlying and bonded to the electrically conductive layer, said joint comprising a bent portion of a first end of said sheet material forming an off-set portion spaced from the reminder of said first end of said sheet material, said off-set portion having an edge part bent into the form of a first dependent leg forming an angle with the remainder of the off-set portion and having said insulative layer on the inside of the bent part, a second end of said sheet material having an edge portion bent into the form of a second dependent leg forming an angle with the remainder of said second end of said sheet material and having said insulative layer on the outside of the bent portion, said first and second ends of said sheet material being assembled with the first and second dependent legs juxtaposed to each other and wherein, when said first and second legs are compressed, each of said first and second legs is collapsed into a position parallel to the top and bottom surfaces of said sheet material whereby conductive surface portions of each of the first and second legs are in face-to-face relationship forming a continuous electrically conductive contact.

8. A joint according to claim 7, wherein the electrically conductive layer is aluminum.

9. A joint according to claim 8, wherein the electrically insulative layer comprises a polyvinyl chloride.

* * * * *